(12) United States Patent
Yue et al.

(10) Patent No.: US 10,312,951 B2
(45) Date of Patent: Jun. 4, 2019

(54) CIRCUITRY AND METHOD FOR CONTROLLING A POWER AMPLIFIER IN A TRANSMIT/RECEIVE SWITCHING SYSTEM

(71) Applicant: Telefonaktiebolaget LM Ericsson (publ), Stockholm (SE)

(72) Inventors: Xiaolong Yue, Beijing (CN); Lei Zhang, Beijing (CN); Zhanyu Wu, Beijing (CN); Jiangyan Peng, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/065,919

(22) PCT Filed: Jan. 25, 2016

(86) PCT No.: PCT/CN2016/071971
§ 371 (c)(1),
(2) Date: Jun. 25, 2018

(87) PCT Pub. No.: WO2017/127977
PCT Pub. Date: Aug. 3, 2017

(65) Prior Publication Data
US 2019/0020364 A1 Jan. 17, 2019

(51) Int. Cl.
*H04B 1/04* (2006.01)
*H04B 1/16* (2006.01)
(Continued)

(52) U.S. Cl.
CPC ................. *H04B 1/04* (2013.01); *H03F 3/19* (2013.01); *H04B 1/16* (2013.01); *H04B 1/18* (2013.01);
(Continued)

(58) Field of Classification Search
CPC .......... H03F 3/19; H04B 1/0458; H04B 1/44; H04B 1/0483; H04B 2001/0408;
(Continued)

(56) References Cited

U.S. PATENT DOCUMENTS 6,914,419 B2 * 7/2005 Katayama ........... H02M 3/1584
323/225
7,633,277 B1 12/2009 Jacoby
(Continued)

FOREIGN PATENT DOCUMENTS

CN 104600984 A 5/2015
EP 0607614 A3 8/1994

*Primary Examiner* — Nhan T Le
(74) *Attorney, Agent, or Firm* — Sage Patent Group (57) ABSTRACT

According to embodiments of the present disclosure, circuitry (400, 600) and method (800) are provided for controlling a power amplifier (10) in a transmit/receive switching system. The circuitry (400, 600) comprises a load circuit (420, 620) for at least partly reducing a magnitude of a swing of a power supply voltage caused by a variation in load of the transmit/receive switching system that occurs upon initiation of a transmission by the transmit/receive switching system. The circuitry (400, 600) further comprises a first switch (410, 610), coupled in series with the load circuit (420, 620), operable to switch on to couple the power supply voltage to a ground voltage via the load circuit (420, 620). The circuitry (400, 600) further comprises a control circuit (430, 630) configured to switch on the first switch (410, 610) at a first timing, and to switch off the first switch (410, 610) and turn on the power amplifier (10) at a second timing. The first timing is a time interval ahead of the second timing.

20 Claims, 7 Drawing Sheets

(51) Int. Cl.
*H03F 3/19* (2006.01)
*H04B 1/18* (2006.01)

(52) U.S. Cl.
CPC .............. *H03F 2200/451* (2013.01); *H04B 2001/0416* (2013.01)

(58) Field of Classification Search
CPC ... H04B 1/18; H04B 1/04; H04B 1/16; H04B 1/40; H04B 2001/0416
See application file for complete search history.

(56) References Cited

U.S. PATENT DOCUMENTS

| | | | | |
|---|---|---|---|---|
| 8,406,824 | B2* | 3/2013 | Taniuchi | H02M 3/07 455/127.1 |
| 8,643,349 | B2* | 2/2014 | Chen | H02M 3/156 323/282 |
| 2006/0217086 | A1* | 9/2006 | Mekechuk | H03F 1/0205 455/126 |
| 2015/0222318 | A1 | 8/2015 | Jerng et al. | |

* cited by examiner

CIRCUITRY AND METHOD FOR CONTROLLING A POWER AMPLIFIER IN A TRANSMIT/RECEIVE SWITCHING SYSTEM

TECHNICAL FIELD

The present disclosure generally relates to wireless communication technologies, and more particularly to circuitry and method for controlling a power amplifier in a transmit/receive switching system (e.g., a Time Division Duplex (TDD) system). The present disclosure also relates to a transmitter, and to a transmit/receive switching system comprising the transmitter.

BACKGROUND

A transmit/receive (TX/RX) switching system, such as a TDD system, does not allow simultaneous transmission and reception of signals as in a Frequency Division Duplex (FDD) system. This enables a simple design of devices, such as eNBs and UEs. However, fast TX/RX switching is quite a challenge for linear operation of a power amplifier (PA) that is used to amplify the signal to be transmitted, since a variation in load of the system due to switching between TX and RX modes typically causes a swing of a power supply voltage of the PA, which swing, in turn, leads to an undesired modulation of the signal being amplified by the PA for transmission.

Figure 1:
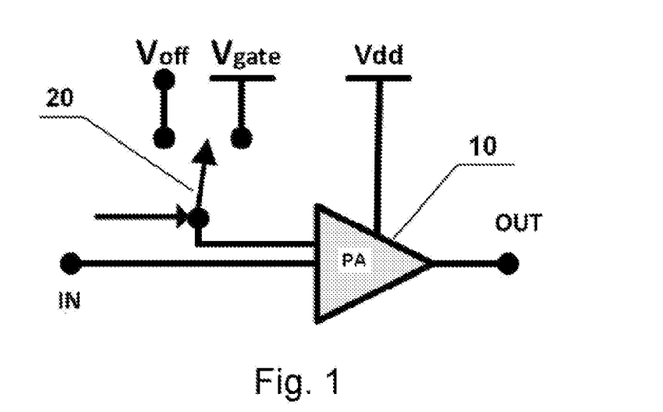
FIG. 1 illustrates a conventional circuit for controlling a power amplifier in a TX/RX switching system.
Figure 2:
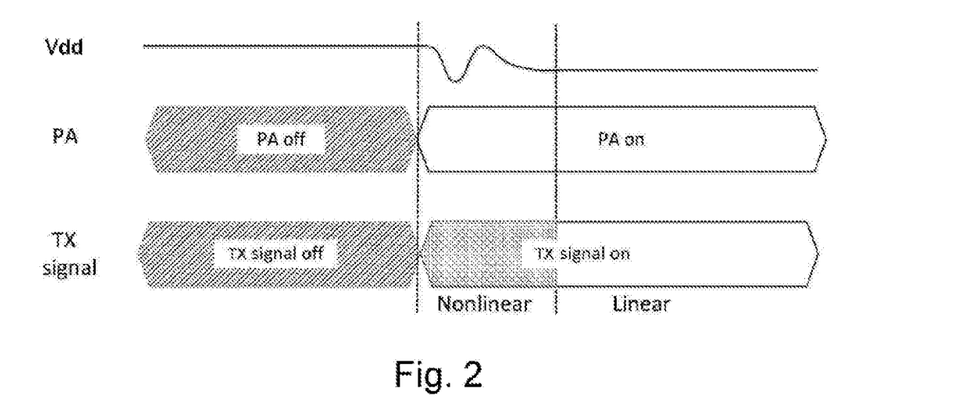
FIG. 2 is a sequence diagram schematically illustrating operation states of the power amplifier circuit as shown in FIG. 1 during switching of the TX/RX switching system from a RX mode to a TX mode.

FIG. 1 illustrates a conventional circuit for controlling a power amplifier in a TX/RX switching system. As is shown, a PA switch 20 is provided to supply a gate bias terminal of the PA 10 with either a gate bias voltage Vgate (which enables the PA) or a turn-off voltage Voff (which disables the PA). Upon switching of the system from the RX mode to the TX mode, the PA 10 is turned on when the transmission is initiated, by causing the PA switch 20 to couple the gate bias terminal of the PA 10 to the gate bias voltage Vgate, instead of to the turn-off voltage Voff. At this point, the signal to be transmitted is input to the PA 10 for amplification. FIG. 2 is a sequence diagram schematically illustrating operation states of the power amplifier circuit as shown in FIG. 1 during switching of the TX/RX switching system from the RX mode to the TX mode. As illustrated, a swing of a power supply voltage (i.e., Vdd) occurs when the PA 10 is turned on, due to a variation in the load of the TX/RX switching system. This Vdd swing, in turn, brings the PA 10 into non-linear operation, thereby imposing an undesired modulation on the TX signal.

Figure 3:
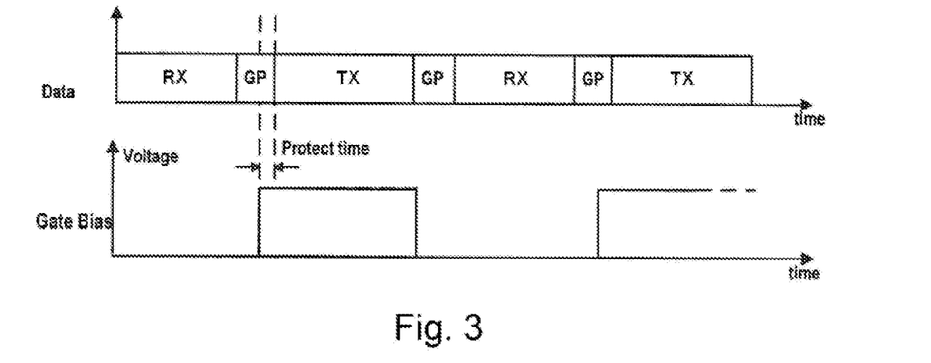
FIG. 3 schematically illustrates a power amplifier control scheme in the prior art.

One solution to this problem may be turning on the PA in advance. FIG. 3 schematically illustrates a power amplifier control scheme in the prior art. As illustrated, reception and transmission of data are conducted alternately, with a Guard Period (GP) provided between each reception and transmission for protection of the switching. In particular, a protection time is provided before initiation of each transmission of the data, meaning that the gate bias voltage is supplied in advance to the PA, such that the PA is well turned on and operates in a linear manner when the transmission is initiated. This way, the TX signal would not be affected by the Vdd swing.

SUMMARY

The Applicant has appreciated that a problem with this control scheme is that the reception of the data may be corrupted due to actuation of the PA ahead of schedule. Especially, the PA still suffers from the Vdd swing and thus experiences non-linear operation.

Thus, it would be desirable to provide an alternative scheme for controlling the power amplifier in the transmit/receive switching system, such as a TDD system.

According to one aspect of the present disclosure, there is provided circuitry for controlling a power amplifier in a transmit/receive switching system. The circuitry comprises a load circuit for at least partly reducing a magnitude of a swing of a power supply voltage caused by a variation in load of the transmit/receive switching system that occurs upon initiation of a transmission by the transmit/receive switching system. The power supply voltage is supplied to the power amplifier. The circuitry further comprises a first switch, coupled in series with the load circuit, operable to switch on to couple the power supply voltage to a ground voltage via the load circuit. The circuitry further comprises a control circuit configured to switch on the first switch at a first timing, and to switch off the first switch and turn on the power amplifier at a second timing. The first timing is a time interval ahead of the second timing.

According to an embodiment, the time interval may be equal to or greater than a duration of the swing of the power supply voltage caused by a variation in load of the transmit/receive switching system that occurs upon initiation of a transmission by the transmit/receive switching system in absence of the circuitry.

According to an embodiment, the duration of the swing of the power supply voltage may be determined from a system configuration. The system configuration may comprise at least one of: capacity of a power source supplying the power supply voltage; and a power consumption level of the power amplifier.

According to an embodiment, the load circuit may be equivalent to the power amplifier in terms of power consumption. The load circuit may comprise a passive circuit, an active circuit, or combination thereof.

According to an embodiment, the control circuit may comprise a control device and a second switch comprising a first terminal for being supplied with a disable voltage for turning off the power amplifier, a second terminal for being supplied with an enable voltage for turning on the power amplifier, and a common terminal for coupling to an enable terminal of the power amplifier. In this example, the control device may be configured to switch on the first switch at the first timing and to switch off the first switch and turn on the power amplifier by causing the second switch to couple the common terminal to the second terminal instead of to the first terminal at the second timing.

According to an embodiment, the control circuit may comprise a control device and a third switch comprising a first terminal for being supplied with the enable voltage and a second terminal for coupling to the enable terminal of the power amplifier. In this example, the control device may be configured to switch on the first switch at the first timing and to switch off the first switch and turn on the power amplifier by switching on the third switch at the second timing.

According to an embodiment, the control circuit may comprise a control device and a voltage generator configured to supply with the enable terminal of the power amplifier either the enable voltage or the disable voltage. In this example, the control device may be configured to switch on the first switch at the first timing and to switch off the first switch and turn on the power amplifier by causing the voltage generator to generate the enable voltage instead of the disable voltage at the second timing. Specifically, the voltage generator may comprise a digital-to-analog converter.

According to another aspect of the present disclosure, there is provided a transmitter for use in a transmit/receive switching system. The transmitter comprises a power amplifier. The transmitter further comprises circuitry as described above.

According to still another aspect of the present disclosure, there is provided a transmit/receive switching system comprising a transmitter as described above.

According to still another aspect of the present disclosure, there is provided a base station comprising a transmit/receive switching system as described above.

According to yet another aspect of the present disclosure, there is provided a method for controlling a power amplifier in a transmit/receive switching system. The method comprises providing a load circuit for at least partly reducing a magnitude of a swing of a power supply voltage caused by a variation in load of the transmit/receive switching system that occurs upon initiation of a transmission by the transmit/receive switching system, the power supply voltage being supplied to the power amplifier; providing a first switch, coupled in series with the load circuit, operable to switch on to couple the power supply voltage to a ground voltage via the load circuit; switching on the first switch at a first timing; and switching off the first switch and turning on the power amplifier at a second timing, wherein the first timing is a time interval ahead of the second timing.

According to an embodiment, the time interval may be equal to or greater than a duration of the swing of the power supply voltage caused by a variation in load of the transmit/receive switching system that occurs upon initiation of a transmission by the transmit/receive switching system without applying the method.

According to an embodiment, the step of turning on the power amplifier may comprise providing a second switch comprising a first terminal for being supplied with a disable voltage for turning off the power amplifier, a second terminal for being supplied with an enable voltage for turning on the power amplifier, and a common terminal for coupling to the enable terminal of the power amplifier; and turning on the power amplifier by causing the second switch to couple the common terminal to the second terminal instead of to the first terminal.

According to an embodiment, the step of turning on the power amplifier may comprise providing a third switch comprising a first terminal for being supplied with the enable voltage and a second terminal for coupling to the enable terminal of the power amplifier; and turning on the power amplifier by switching on the third switch.

According to an embodiment, the step of turning on the power amplifier may comprise providing a voltage generator configured to supply with the enable terminal of the power amplifier either the enable voltage or the disable voltage; and turning on the power amplifier by causing the voltage generator to generate the enable voltage instead of the disable voltage.

Advantageously, embodiments of the present disclosure enable enhancement of a linear performance of the power amplifier that is used in the transmit/receive switching system (e.g. a LAA-LTE system) to amplify the signal to be transmitted.

BRIEF DESCRIPTION OF THE DRAWINGS

Embodiments of the present disclosure will now be described by way of example only with reference to the accompanying drawings, in which.

DETAILED DESCRIPTION

Embodiments of the present disclosure will now be described more fully hereinafter with reference to the accompanying drawings. These embodiments may, however, be embodied in many different forms and the scope of protection should not be construed as limited to the embodiments set forth herein; rather, these embodiments are provided for thoroughness and completeness, and to fully convey the scope of the disclosure to the skilled addressee. Like reference characters refer to like elements throughout.

Figure 4:
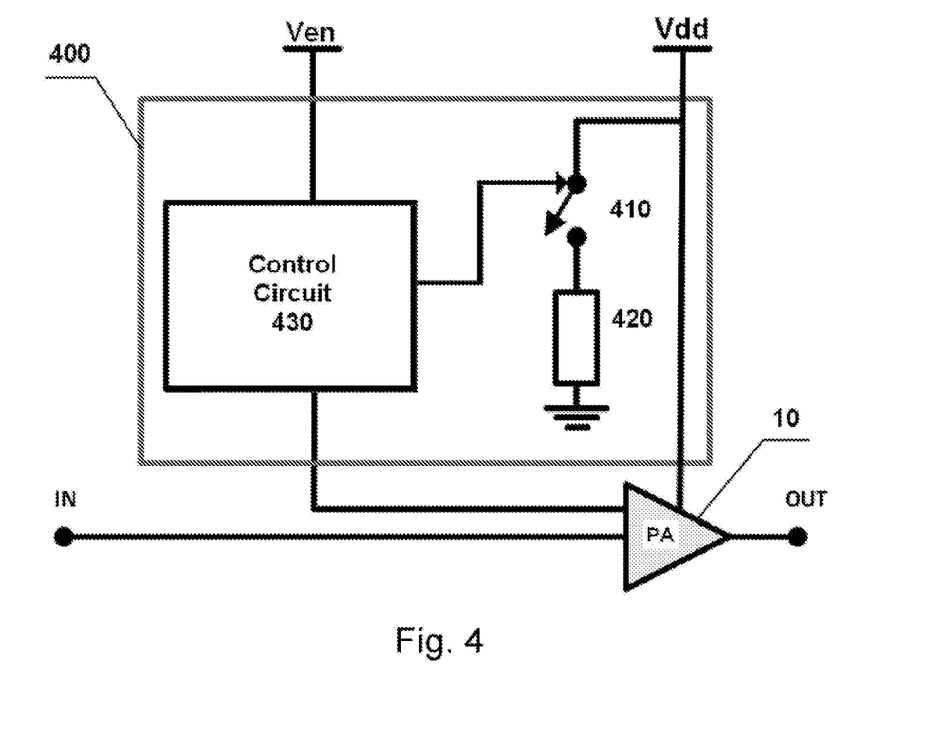
FIG. 4 illustrates a power amplifier circuit comprising circuitry for controlling a power amplifier in a TX/RX switching system according to an embodiment of the present disclosure.

FIG. 4 illustrates a power amplifier circuit comprising circuitry 400 for controlling a power amplifier 10 in a TX/RX switching system according to an embodiment of the present disclosure. The TX/RX switching system may be a TDD system, such as TDD-LTE or LAA-LTE. The power amplifier 10 comprises a power terminal for coupling to a power supply voltage Vdd and an enable terminal for coupling to an enable voltage Ven. The enable terminal of the power amplifier 10 is typically a gate bias terminal, and thus the enable voltage is a gate bias voltage. However, it should be appreciated that the type of the enable terminal and the value of the enable voltage may vary from one PA model to another.

In this example, the circuitry 400 comprises a load circuit 420. The load circuit 420 functions to suffer/absorb a Vdd swing, in advance and in place of the power amplifier 10, so as to at least partly reduce a magnitude of the Vdd swing that occurs upon initiation of a transmission by the TX/RX switching system. The circuitry 400 further comprises a first switch 410, which is coupled in series with the load circuit 420 and operable to switch on to couple the power supply voltage Vdd to a ground voltage via the load circuit 420. It should be understood that while the first switch 410 is illustrated as being coupled between the power supply voltage Vdd and the load circuit 420, it may alternatively be coupled between the load circuit 420 and the ground voltage. The circuitry 400 further comprises a control circuit 430 for controlling switching ON/OFF of the first switch 410 and turning ON/OFF of the power amplifier 10.

Figure 5:
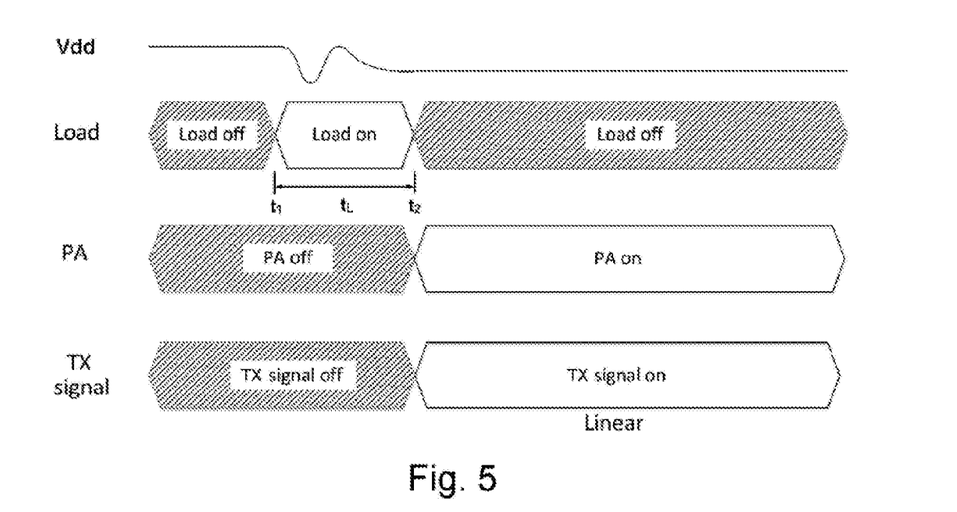
FIG. 5 is a sequence diagram schematically illustrating operation states of the power amplifier circuit as shown in FIG. 4 during switching of the TX/RX switching system from a RX mode to a TX mode.

FIG. 5 is a sequence diagram schematically illustrating operation states of the power amplifier circuit as shown in FIG. 4 during switching of the TX/RX switching system from a RX mode to a TX mode. Operations of the circuitry 400 are now described in more detail with reference to FIGS. 4 and 5.

In this example, the control circuit 430 of the circuitry 400 is configured to switch on the first switch 410 at a first timing $t_1$. The first timing $t_1$ may be during switching of the TX/RX switching system from a RX mode to a TX mode. The control circuit 430 is further configured to switch off the first switch 410 and to turn on the power amplifier 10 at a second timing $t_2$. Turning on of the power amplifier may be done by causing the enable voltage Ven to be supplied to the enable terminal of the power amplifier 10. In particular, the first timing $t_1$ is a time interval $t_L$ ahead of the second timing $t_2$.

The second timing $t_2$ may correspond to a time when the transmission is initiated by the TX/RX switching system. For example, in a TDD system, the second timing $t_2$ may be a scheduled time when a TX signal should be transmitted according to the communication protocol. By way of example, and not limitation, the second timing $t_2$ may be resolved from information contained in a special subframe of a baseband signal. The special subframe contains TDD synchronization information, such as time reference information, from which the time lengths of the RX time slot, the GP, and the TX time slot can be determined. The TDD synchronization information may be extracted from the special subframe by for example a baseband signal processor. The baseband signal processor may then determine the beginning of the TX time slot (i.e., the second timing $t_2$) based on the time lengths of the RX time slot, the GP, and the TX time slot and other time reference information. In an implementation, the baseband signal processor may be implemented as part of the control circuit 430. Alternatively, the baseband signal processor may be a stand-alone processor provided in the TX/RX switching system, in which case a timing signal indicating the second timing $t_2$ may be transmitted from the baseband signal processor to the control circuit 430.

The first timing $t_1$ may also be determined and transmitted to the control circuit 430 by the baseband signal processor. In this example, the first timing $t_1$ may fall within an interval $[t_0, t_2-t_L]$, where $t_0$ denotes the beginning of the switching of the TX/RX switching system from the RX mode to the TX mode, and $t_L$ denotes the time interval between the first timing $t_1$ and the second timing $t_2$. Generally, the time interval $t_L$ may be of any appropriate value to the extent that it allows the load circuit 420 time to "absorb" the Vdd swing such that the magnitude of the subsequent swing suffered by the power amplifier 10 will at least partly be reduced upon initiation of the transmission.

In an embodiment, the time interval $t_L$ may be equal to or greater than a duration of the Vdd swing caused by a variation in load of the TX/RX switching system that occurs upon initiation of the transmission in absence of the circuitry 400. In absence of the circuitry 400, the variation in the load of the TX/RX switching system, occurring upon initiation of the transmission, may be considered as primarily due to actuation of the power amplifier 10. The actuation of the power amplifier 10 then causes a surge current, thereby resulting in the Vdd swing. In turn, the resultant Vdd swing generally reflects a limited capacity of the power source which supplies the Vdd voltage in the TX/RX switching system. Thus, the duration of the Vdd swing may be determined from a system configuration. Specifically, the system configuration may comprise at least one of: the capacity of the power source supplying the power supply voltage Vdd; and a power consumption level of the power amplifier 10.

With such a time interval $t_L$, the load circuit 420, after being switched on, has a period of time to "absorb" the resultant Vdd swing. Thus, a reduced swing of the Vdd voltage may be suffered by the power amplifier 10 when subsequently the scheduled time for transmission (i.e., the second timing $t_2$) is coming.

In this example, the load circuit 420 may advantageously be equivalent to the power amplifier 10 in terms of the power consumption. In this case, switching ON of the load circuit 420 causes the same Vdd swing in magnitude as in the case where the power amplifier 10 is turned on in absence of the circuitry 400. However, since the load circuit 420 is switched on ahead of the initiation of the transmission, the load circuit 420 may have sufficient time (i.e., the time interval $t_L$) to absorb the resultant Vdd swing, such that when the power amplifier 10 is turned on at the second timing $t_2$, the Vdd voltage may have become sufficiently stable. Further, since the load circuit 420 is switched off at the same time (i.e., the second timing $t_2$) when the power amplifier 10 is turned on, even no variation in the load will be present due to the equivalence of the load circuit 420 and the power amplifier 10. As illustrated in FIG. 5, the Vdd swing thus is almost invisible to the power amplifier 10, and the TX signal being amplified by the power amplifier 10 will simply not subject to an undesired modulation resulting from the Vdd swing.

In other examples, however, the load circuit 420 may consume more or less power than the power amplifier 10 under the same condition, as long as it reduces the magnitude of the Vdd swing caused by the variation in the load of the TX/RX switching system that occurs upon initiation of the transmission. For example, the load circuit 420 may consume 50% more power than the power amplifier 10. For another example, the load circuit 420 may consume 50% less power than the power amplifier 10. In either case, when the load circuit 420 is disconnected (by switching off the first switch 410) and the power amplifier 10 is simultaneously turned on upon initiation of the transmission, the variation in the load of the TX/RX switching system will be half of that in the case where the load circuit 420 is absent and the power amplifier 10 alone is turned on upon initiation of the transmission. That is, the variation in the load of the TX/RX switching system is still reduced, and thus the impact of the Vdd swing to the power amplifier 10 is partially suppressed.

Additionally, it should be understood that while the load circuit 420 is represented by a resistor symbol in FIG. 4, it may comprise a passive circuit (such as a simple resistor), an active circuit, or combination thereof. Implementations of the load circuit are known in the art and thus are not discussed here in detail.

Figure 6A:
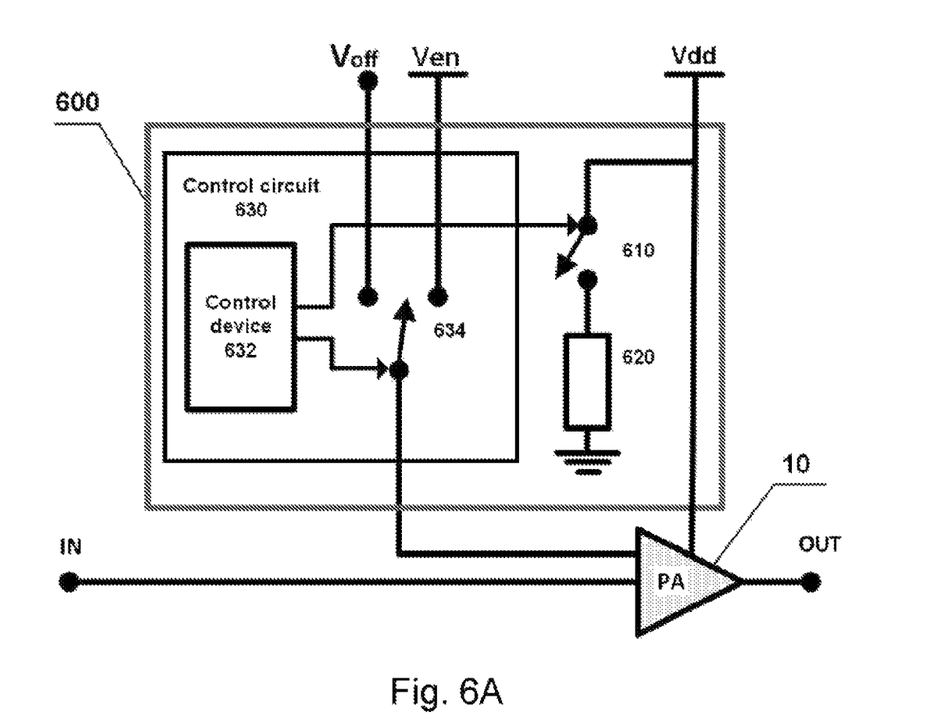
FIG. 6A illustrates an implementation of circuitry for controlling a power amplifier in a TX/RX switching system according to an embodiment of the present disclosure.

FIG. 6A illustrates an implementation of circuitry 600 for controlling a power amplifier 10 in a TX/RX switching system according to an embodiment of the present disclosure. The circuitry 600 may be regarded as an implementation of the circuitry 400 as show in FIG. 4.

In this example, the control circuit 630 comprises a control device 632 and a second switch 634. The second switch 634 comprises a first terminal for coupling to a disable voltage Voff for turning off the power amplifier 10, a second terminal for coupling to the enable voltage Ven, and a common terminal for coupling to the enable terminal (e.g., the gate bias terminal) of the power amplifier 10. The control device 632 is configured to switch on the first switch 610 at the first timing $t_1$. The control device 632 is further configured to switch off the first switch 610 and to turn on the power amplifier 10 by causing the second switch 634 to couple the common terminal to the second terminal instead of to the first terminal at the second timing $t_2$.

Figure 6B:
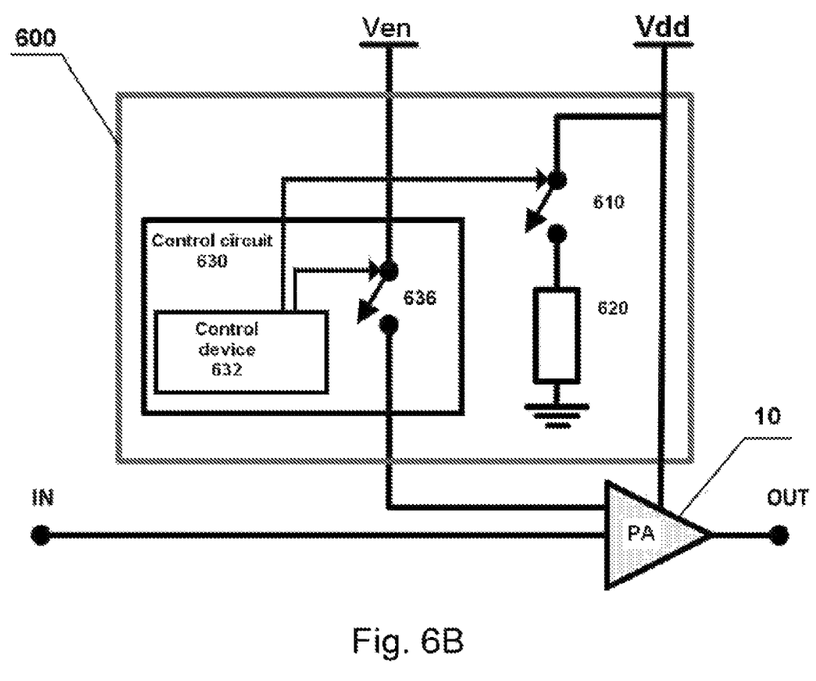
FIG. 6B illustrates another implementation of circuitry for controlling a power amplifier in a TX/RX switching system according to an embodiment of the present disclosure.

FIG. 6B illustrates another implementation of circuitry 600 for controlling a power amplifier 10 in a TX/RX switching system according to an embodiment of the present disclosure. The circuitry 600 may be regarded as another implementation of the circuitry 400 as show in FIG. 4.

In this example, the control circuit 630 comprises a control device 632 and a third switch 636. The third switch 636 comprises a first terminal for coupling to the enable voltage Ven and a second terminal for coupling to the enable terminal of the power amplifier 10. The control device 632 is configured to switch on the first switch at the first timing $t_1$. The control device 632 is further configured to switch off the first switch 610 and turn on the power amplifier 10 by switching on the third switch 636 at the second timing $t_2$.

Figure 6C:
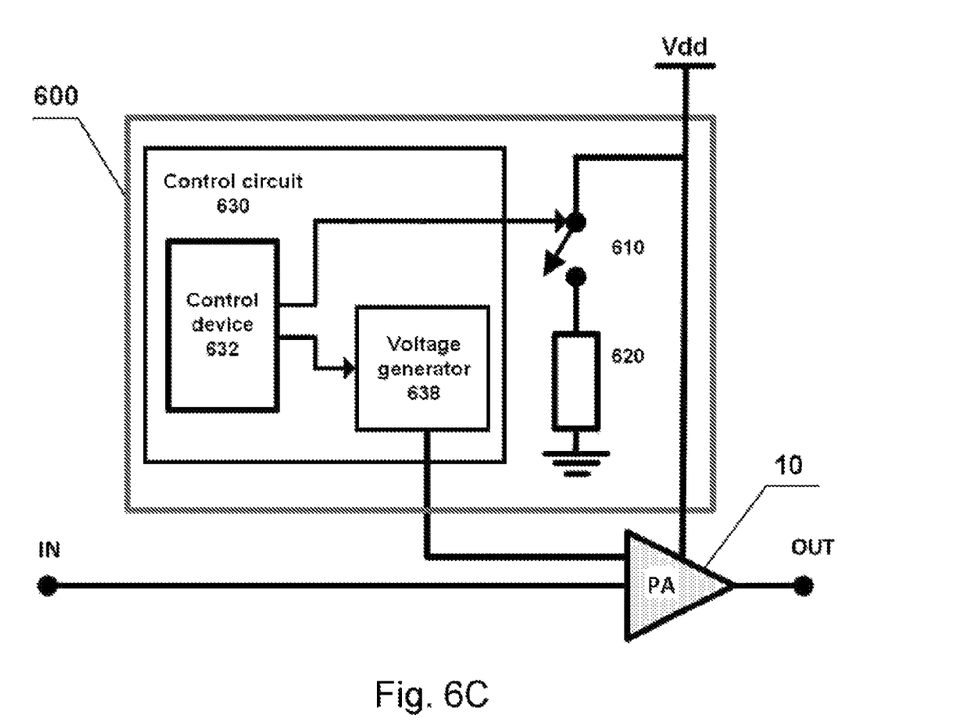
FIG. 6C illustrates yet another implementation of circuitry for controlling a power amplifier in a TX/RX switching system according to an embodiment of the present disclosure.

FIG. 6C illustrates yet another implementation of circuitry 600 for controlling a power amplifier 10 in a TX/RX switching system according to an embodiment of the present disclosure. The circuitry 600 may be regarded as yet another implementation of the circuitry 400 as show in FIG. 4.

In this example, the control circuit 630 comprises a control device 632 and a voltage generator 638. The voltage generator 638 is configured to supply with the enable terminal of the power amplifier 10 either the enable voltage Ven or a disable voltage Voff. The control device 632 is configured to switch on the first switch 610 at the first timing $t_1$. The control device 632 is further configured to switch off the first switch 610 and to turn on the power amplifier 10 by causing the voltage generator 638 to generate the enable voltage Ven instead of the disable voltage Voff at the second timing $t_2$.

The control device 632 as shown in FIGS. 6A, 6B and 6C may be implemented as any control logic, including a microcontroller, a field programmable gate array (FPGA), a complex programmable logic device (CPLD), and the like. As illustrated, the second switch 634 may be a controlled single-pole-double-throw (SPDT) switch, and the third switch 636 may be a controlled single-pole-single-throw (SPST) switch. In an implementation, the voltage generator 638 of FIG. 6C may comprise a commonly used digital-to-analog converter (not shown). The digital-to-analog converter may be configured to output the required voltage under the control of the control device 632. In either case, the circuitry 600 can be implemented in an easy and cost-effective way.

Figure 7:
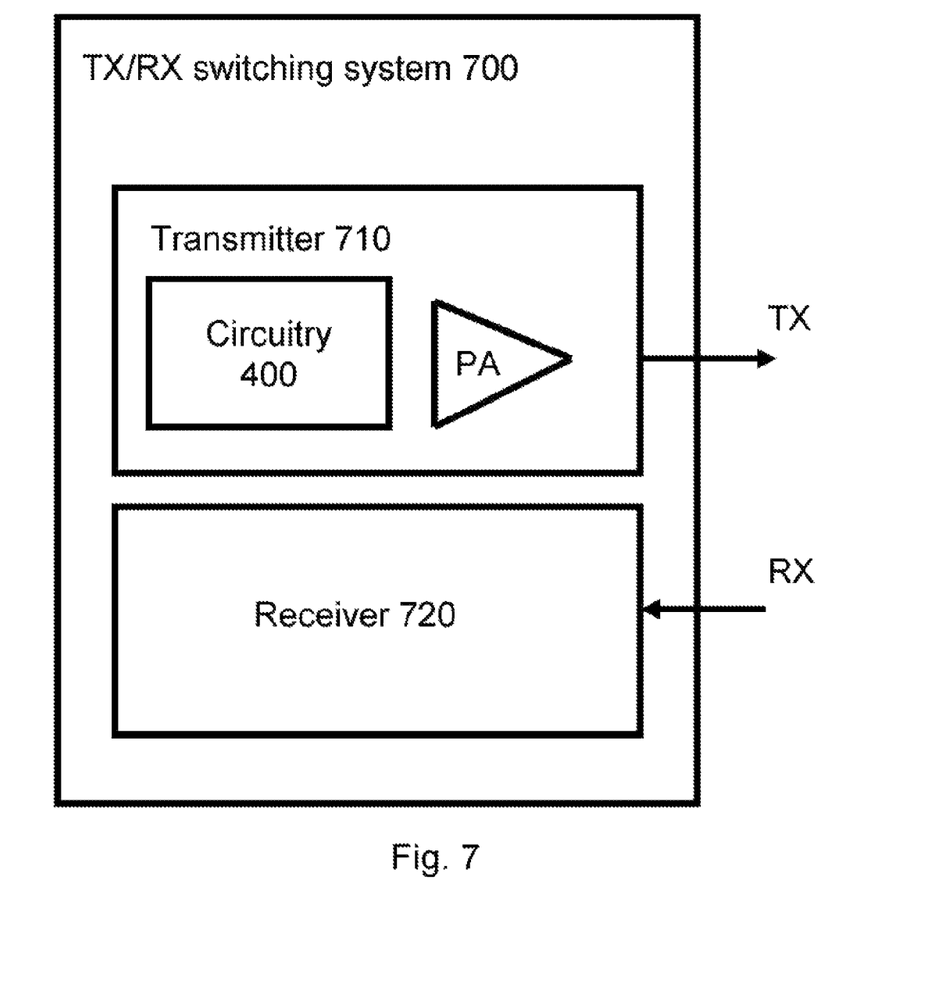
FIG. 7 is a block diagram illustrating a TX/RX switching system according to an embodiment of the present disclosure.

FIG. 7 is a block diagram illustrating a TX/RX switching system 700 according to an embodiment of the present disclosure. As illustrated, the TX/RX switching system 700 comprises a transmitter 710 for transmission of signals. In particular, the transmitter 710 comprises the circuitry 400 as described above. Details of the circuitry 400 have been described with respect to FIGS. 4 to 6C, and thus are not discussed here for simplicity. The TX/RX switching system 700 may further comprise a receiver 720 for reception of signals. In operation, the TX/RX switching system 700, such as a TDD system, may switch between a TX mode and a RX mode. In an implementation, the TX/RX switching system 700 may form or be part of a base station (not shown).

Figure 8:
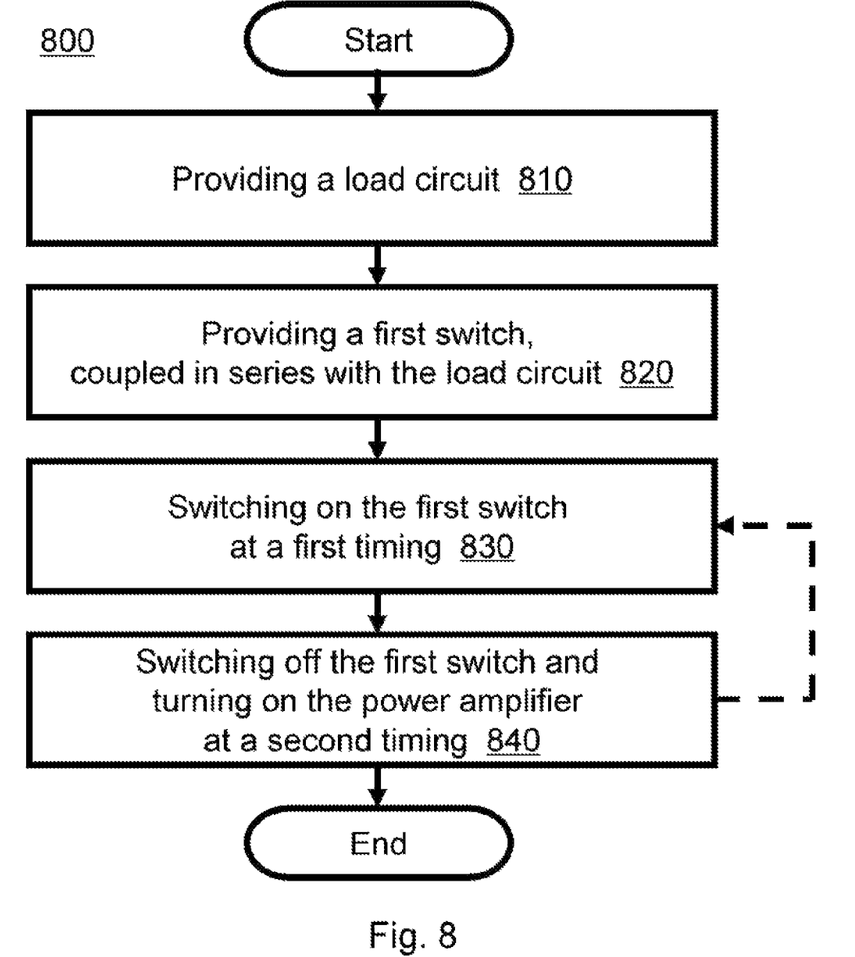
FIG. 8 is a flow chart of a method for controlling a power amplifier in a TX/RX switching system according to an embodiment of the present disclosure.

FIG. 8 is a flow chart of a method 800 for controlling a power amplifier in a TX/RX switching system according to an embodiment of the present disclosure. The power amplifier comprises a power terminal for being supplied with a power supply voltage and an enable terminal for being supplied with an enable voltage.

At step 810, a load circuit is provided for at least partly reducing a magnitude of a swing of the power supply voltage caused by a variation in load of the TX/RX switching system that occurs upon initiation of a transmission by the TX/RX switching system.

At step 820, a first switch is provided for being coupled in series with the load circuit and being operable to switch on to couple the power supply voltage to a ground voltage via the load circuit.

At step 830, the first switch is switched on at a first timing. The first timing may be during switching of the TX/RX switching system from a receive mode to a transmit mode.

At step 840, the first switch is switched off and the power amplifier is turned on at a second timing. Turning on of the power amplifier may be done by causing the enable voltage to be supplied to the enable terminal of the power amplifier. In particular, the first timing is a time interval ahead of the second timing.

It should be understood that details of the method 800 are substantially similar to the operations as described above with respect to circuitry 400, 600, and thus are not discussed here in detail for simplicity. It however should also be understood that step 830 and step 840 may be performed recursively as indicated by the dashed arrow in FIG. 8, as the switching of the TX/RX switching system continues. In this case, the power amplifier is turned off at the end of each transmission, which is not reflected in FIG. 8 although.

Advantageously, embodiments of the present disclosure enable enhancement of a linear performance of the power amplifier used in the TX/RX switching system to amplify the signal to be transmitted. In some embodiments, the Vdd swing may even be almost invisible to the power amplifier. Moreover, the circuitry according to embodiments of the present disclosure can be implemented in an easy and cost-effective way.

Another advantage is that since the linear performance of the power amplifier is enhanced, the valid time for transmission of a TX signal is increased. In other words, the available time for downlink transmission could be increased.

The person skilled in the art realizes that the present disclosure by no means is limited to the embodiments described above. On the contrary, many modifications and variations are possible within the scope of the appended claims.

The invention claimed is:

1. Circuitry for controlling a power amplifier in a transmit/receive switching system, the circuitry comprising:
   a load circuit operable to at least partly reduce a magnitude of a swing of a power supply voltage of the power amplifier due to a variation in load of the transmit/receive switching system that occurs upon initiating transmission by the transmit/receive switching system;
   a first switch coupled in series with the load circuit and operable, when switched on, to couple the power supply voltage to a ground voltage via the load circuit; and
   a control circuit configured to:
      at a first timing, switch on the first switch; and at a second timing, wherein the first timing is a time interval ahead of the second timing:
switch off the first switch; and
turn on the power amplifier.

2. The circuitry according to claim 1, wherein the time interval is equal to or greater than a duration of the swing of the power supply voltage in absence of the circuitry.

3. The circuitry according to claim 2, wherein the duration of the swing of the power supply voltage is determined from a system configuration.

4. The circuitry according to claim 3, wherein the system configuration comprises at least one of: capacity of a power source supplying the power supply voltage; and a power consumption level of the power amplifier.

5. The circuitry according to claim 1, wherein the load circuit is equivalent to the power amplifier in terms of power consumption.

6. The circuitry according to claim 1, wherein the load circuit comprises a passive circuit, an active circuit, or combination thereof.

7. The circuitry according to claim 1, wherein the control circuit comprises:
a second switch comprising a first terminal for being supplied with a disable voltage for turning off the power amplifier, a second terminal for being supplied with an enable voltage for turning on the power amplifier, and a common terminal for coupling to an enable terminal of the power amplifier; and
a control device configured to:
at the first timing, switch on the first switch; and
at the second timing, switch off the first switch and turn on the power amplifier by causing the second switch to couple the common terminal to the second terminal instead of to the first terminal.

8. The circuitry according to claim 1, wherein the control circuit comprises:
a third switch comprising a first terminal for being supplied with an enable voltage for turning on the power amplifier age and a second terminal for coupling to the enable terminal of the power amplifier; and
a control device configured to:
at the first timing, switch on the first switch; and
at the second timing, switch off the first switch and turn on the power amplifier by switching on the third switch.

9. The circuitry according to claim 7, wherein the control circuit comprises:
a voltage generator configured to supply, to the enable terminal of the power amplifier, one of an enable voltage for turning on the power amplifier and a disable voltage for turning off the power amplifier; and
a control device configured to:
at the first timing, switch on the first switch; and
at the second timing, switch off the first switch and turn on the power amplifier by causing the voltage generator to generate the enable voltage instead of the disable voltage.

10. The circuitry according to claim 9, wherein the voltage generator comprises a digital-to-analog converter.

11. A transmitter for use in a transmit/receive switching system, comprising:
a power amplifier; and
circuitry according to claim 1.

12. A transmit/receive switching system comprising a transmitter according to claim 11.

13. A base station comprising a transmit/receive switching system according to claim 12.

14. A method for controlling a power amplifier, in a transmit/receive switching system, for at least partly reducing a magnitude of a swing of a power supply voltage of the power amplifier due to a variation in load of the transmit/receive switching system that can occur upon initiating transmission by the transmit/receive switching system, the method comprising:
switching on a first switch at a first timing, the first switch being coupled in series with a load circuit and being operable to switch on to couple the power supply voltage to a ground voltage via the load circuit; and
at a second timing, wherein the first timing is a time interval ahead of the second timing:
switching off the first switch; and
turning on the power amplifier.

15. The method according to claim 14, wherein the time interval is equal to or greater than a duration of the swing of the power supply voltage without performing the switching on and the switching off operations.

16. The method according to claim 14, wherein the load circuit is equivalent to the power amplifier in terms of power consumption.

17. The method according to claim 14, wherein turning on the power amplifier comprises causing a second switch to couple a common terminal of the second switch to a second terminal of the second switch instead of to a first terminal of the second switch, wherein:
the first terminal is supplied with a disable voltage for turning off the power amplifier;
the second terminal is supplied with an enable voltage for turning on the power amplifier; and
the common terminal is coupled to an enable terminal of the power amplifier.

18. The method according to claim 14, wherein turning on the power amplifier comprises switching on a third switch, wherein the third switch comprises a first terminal supplied with the enable voltage and a second terminal for coupling to an enable terminal of the power amplifier.

19. The method according to claim 14, wherein turning on the power amplifier comprises causing a voltage generator to generate an enable voltage instead of a disable voltage, wherein the voltage generator is configured to supply an enable terminal of the power amplifier with either the enable voltage or the disable voltage.

20. The method according to claim 19, wherein the voltage generator comprises a digital-to-analog converter.

* * * * *